United States Patent [19]

Marsella et al.

[11] Patent Number: 6,120,978
[45] Date of Patent: Sep. 19, 2000

[54] USE OF N,N-DIALKYL UREAS IN PHOTORESIST DEVELOPERS

[75] Inventors: John Anthony Marsella, Allentown; Kevin Rodney Lassila, Macungie, both of Pa.

[73] Assignee: Air Products and Chemicals, Inc., Allentown, Pa.

[21] Appl. No.: 09/478,732

[22] Filed: Jan. 6, 2000

[51] Int. Cl.$^7$ .............................. G03C 5/30; G03F 7/32; C11D 1/50
[52] U.S. Cl. ........................... 430/331; 510/176
[58] Field of Search .............................. 430/331; 510/176

[56] References Cited

U.S. PATENT DOCUMENTS 5,821,036 10/1998 Ficner et al. ........................... 430/331
5,985,968 11/1999 Lassila et al. .......................... 524/211

FOREIGN PATENT DOCUMENTS 3-062034 3/1991 Japan .

OTHER PUBLICATIONS

Microlithography, Science and Technology edited by James R. Sheats and Bruce w. Smith, Marcel Dekker, Inc. 1998, pp. 551–553.

Maekawa et al., Dissolution Inhibitory Effect of Urea Additives on a Carboxyl Polymer Through a Supramolecular Structure, Journal of Photopolymer Science and Technology, vol. 11, 3 (1998) 533–536.

*Primary Examiner*—Hoa Van Le
*Attorney, Agent, or Firm*—Michael Leach

[57] ABSTRACT

This invention provides water-based photoresist developer/electronics cleaning compositions manifesting reduced equilibrium and dynamic surface tension by the incorporation as surfactant of an effective amount of certain N,N-dialkyl urea compounds of the structure

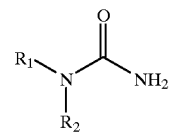

where R and R' are independently C1 to C6 alkyl or cycloalkyl with the sum of the carbon atoms in both R and R' being 6 to 12.

20 Claims, No Drawings

USE OF N,N-DIALKYL UREAS IN PHOTORESIST DEVELOPERS

FIELD OF THE INVENTION

The invention relates to the use of N,N-dialkyl ureas as a wetting agent in aqueous photoresist developer and electronics cleaning compositions.

BACKGROUND OF THE INVENTION

The demands of semiconductor manufacture have required the use of high performance surfactants and wetting agents in photoresist developer formulations. As line features shrink to smaller sizes and photoresist substrate materials become more aliphatic in nature (i.e. having lower surface energy), aqueous developer solutions are being formulated with surface tension reducing agents. Another requirement for these developers is that they have a low tendency to foam. This is accentuated by the movement toward larger wafer sizes. Low foam formation is particularly important when using spray-puddle techniques because microbubble entrainment during spreading of the solution over the photoresist surface can lead to defects. Surfactants that have been used in the past to increase wetting of the photoresist typically lead to higher foam formation. For the most part the industry has focused on the effect of surfactant on photoresist performance, such as contrast, critical dimension, and feature sharpness. Although the cleaning ability of underlying substrates is enhanced by typical surfactants, foam formation still remains a problem.

Tetramethylammonium hydroxide (TMAH) is the chemical of choice in aqueous alkaline solutions for developing photoresists according to *Microlithography, Science and Technology*, edited by J. R. Sheats and B. W. Smith, Marcel Dekker, Inc., 1998, pp 551–553. Surfactants are added to the aqueous TMAH solutions to reduce development time and scumming and to improve surface wetting.

U.S. Pat. No. 5,985,968 discloses the use of 1,1-dialkyl ureas to reduce equilibrium and dynamic surface tension in aqueous compositions.

There are few references describing low foam surfactants in developer compositions. JP 10-319606 discloses that commercially available ethylene oxide (EO)/propylene oxide (PO) block polymers give good wetting and low foam.

JP 03-062034 discloses polyoxyalkylene dimethyl polysiloxanes as good surfactants with low foam in developer formulations. Polysiloxanes are known to rearrange or decompose under conditions of high pH.

Although there are a few references to the use of ureas in photoresist developer compositions, they are not related to the use of surface active agents. U.S. Pat. No. 4,997,748 discloses cyclic nitrogen compounds at levels of 0.1 to 10 wt % to decrease scum formation and enhance image sharpness during photoresist development. Among the cyclic nitrogen compounds taught is the cyclic urea 1,3-dimethyl-2-imidazolidinone. Since the nitrogen compounds are not amphipathic, it is not likely that they will lower surface tensions at low concentrations, and their utility appears to be based on properties other than surface tension reduction. 1,3-dimethyl-2-imidazolidinone is well known as a very good solvent and not as a surface-active material.

Maekawa et al, "Dissolution Inhibitory Effect of Urea Additives on a Carboxyl Polymer Through a Supramolecular Structure", disclose the use of 1,3-disubstituted ureas to modify the dissolution characteristics of photosensitive carboxyl-polymers I TMAH solution. The amounts of the ureas were not specified, but it is clear that their role is to actively bind to the resin and not to lower the surface tension of the developer.

SUMMARY OF THE INVENTION

This invention provides water-based photoresist developing, or electronics cleaning, compositions having reduced equilibrium and dynamic surface tension by incorporation of an effective amount of certain N,N-dialkyl urea compounds of the structure

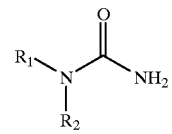

where R and R' are independently C1 to C6 alkyl or cycloalkyl with the sum of carbon atoms in both R and R' being 6 to 12.

By "water-based", "aqueous" or "aqueous medium" we mean, for purposes of this invention, a solvent or liquid dispersing medium which comprises at least about 90 wt %, preferably at least about 95 wt %, water. Obviously, an all water medium is also included and is most preferred. Also for purposes of the present invention, the terms "photoresist developing" and "electronics cleaning" are interchangeable.

Also provided is a method for developing a photoresist after exposure to radiation by applying to the photoresist surface a water-based developer composition containing an effective amount of an N,N-dialkyl urea compound of the above structure for reducing the dynamic surface tension of the composition.

There are significant advantages associated with the use of these N,N-dialkyl urea compounds in water-based photoresist developer, or electronics cleaning, compositions and these advantages include:

an ability to control the foaming characteristics of the water-based compositions; and an ability to formulate low surface tension aqueous electronics cleaning and processing solutions, including photoresist developer solutions, for the semiconductor manufacturing industry with good wetting and extremely low foam.

The use of these materials in photoresist developer formulations is of particular importance because of their ability to provide all the advantages of surface tension lowering plus outstanding performance in reducing the formation of foam and doing so while maintaining good contrast for photoresist developing applications.

DETAILED DESCRIPTION OF THE INVENTION

This invention relates to the use of compounds of the formula

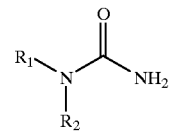

where R and R' are independently C1 to C6 alkyl or cycloalkyl with the total number of carbons in R and R' being 6–12 for the reduction of equilibrium and dynamic surface tension and low foaming in water-based photoresist developer formulations. It is desirable that an aqueous solution of the N,N-dialkyl urea demonstrates a dynamic surface tension of less than 45 dynes/cm at a concentration of ≦5 wt % in water at 23° C. and 1 bubble/second according to the maximum-bubble-pressure method. The maximum-bubble-pressure method of measuring surface tension is described in *Langmuir* 1986, 2, 428–432, which is incorporated by reference.

The N,N-dialkyl ureas suitable for use in the present invention are those taught in U.S. Pat. No. 5,985,968. This reference also teaches how to make these dialkyl ureas.

Generally, in the practice of this invention, it is desirable to choose alkyl groups such that the resulting dialkylureas have a solubility in water of at least 0.001 wt %, preferably from 0.001 to 1 wt %, and most preferably from 0.005 to 0.5 wt %.

The alkyl groups may be the same or different. They may be linear or branched, and the point of attachment to the nitrogen may be on either an internal or terminal carbon. The total number of carbons on the alkyl substituents should be at least 6; fewer than this diminishes the surface activity of the urea too greatly. The total number of carbons should be no greater than 12; a greater number decreases the solubility of the material to such a degree that its use in many formulations is impractical. Examples of suitable alkyl groups are methyl, ethyl, n-propyl, isopropyl, n-butyl, isobutyl, sec-butyl, n-pentyl, 2-pentyl, 3-pentyl, isopentyl, n-hexyl, 2-hexyl, 3-hexyl, cyclohexyl, and the like. Preferred derivatives contain 8 to 10 alkyl carbons. The alkyl carbons may be distributed among the alkyl substituents in any manner, although derivatives in which the alkyl groups contain equivalent numbers of carbons are preferred because parent amines of this type are most economical and readily available.

An amount of the dialkyl urea compound that is effective to reduce the equilibrium and/or dynamic surface tension of the water-based photoresist developer/electronics cleaning composition is added. Such effective amount may range from 0.001 to 1 g/100 ml, preferably 0.005 to 0.5 g/100 ml, of the aqueous composition. Naturally, the most effective amount will depend on the particular application and the solubility of the N,N-dialkyl urea.

The use of the dialkyl urea as a surfactant is particularly advantageous in the developers for photoresists that are employed in the semiconductor industry. Such developers and their use are well known in the art and do not need to be described in detail. The improvement provided by this invention, which could not have been foreseen, involves the use in these developer formulations of certain N,N-dialkyl ureas containing 6 to 12 carbon atoms in the alkyl groups.

In the following water-based photoresist developer, or electronic cleaning, composition containing a dialkylurea according to the invention, other optional components of such compositions are those materials well known to the workers in the art. A typical water-based photoresist developer, or electronic cleaning, composition to which the dialkyl ureas may be added would comprise an aqueous medium containing the following components:

| Water-Based Photoresist Developer Composition | |
|---|---|
| 0.1 to 3 wt % | Tetramethylammonium Hydroxide |
| 0 to 4 wt % | Phenolic Compound |
| 10 to 10,000 ppm | NN-Dialkyl Urea |

Briefly, the process for manufacture of integrated circuits involves the application of a film of photoresist composition to a suitable substrate, such as a silicon wafer, which is then exposed to actinic radiation in a design pattern that is imposed upon the photoresist film. Depending upon whether the photoresist is positive or negative-working, the radiation either increases or decreases its solubility in a subsequently applied developer solution. Consequently, in a positive-working photoresist the areas masked from the radiation remain after development while the exposed areas are dissolved away. In the negative-working photoresist the opposite occurs. The surfactant of this invention can be used in developers for either type of photoresist. The character of the developer is very important in determining the quality of the circuits formed and precise control of developing is essential. To achieve better surface wetting by the developer is has been common to add surfactant to the formulation in order to reduce surface tension of the solution. This addition, however, can cause the developer to foam which leads to circuit defects. This foaming-problem is also recognized in the art and considerable attention in the industry has been directed toward its solution.

The aqueous developer, or electronics cleaning, solutions in which use of the dialkyl ureas is preferred are the aqueous solutions of tetramethylammonium hydroxide (TMAH). These developers are also well known in the art. Commercial developers usually contain low levels of surfactant on the order of 50 to 1000 ppm by weight. Surfactant level should not exceed that required to achieve the desired surface tension of the solution. For example, surface tensions of about 40 to 45 dynes/cm would be appropriate for novolac-based photoresist resins. Advanced resins that often incorporate aliphatic groups might require a developer with lower surface tension to enhance wetting. One of the advantages of the surfactants of this invention is that suitable surface tensions can be obtained at lower levels than is required by other wetting agents. This in itself is a step toward solving the foaming problem in the manufacture of microcircuitry.

The disclosure of U.S. Pat. No. 5,985,968, which patent relates to the use of N,N-dialkyl ureas as surfactants in aqueous compositions, is hereby incorporated by reference.

EXAMPLE 1

This example illustrates the preparation of N,N-dibutylurea. Di-n-butylamine (56.9 g) was mixed with 300 mL ice water and neutralized with about 76 mL 5 M HCl. Neutralization was confirmed by measuring the pH and adjusting as needed with HCl or dibutylamine to give a pH of 7. The solution was heated to about 80° C. and 35.7 g potassium cyanate was added in one to five gram portions. An organic layer formed after a few minutes and heating was continued at 80° C. for two hours. The organic layer was dissolved in a minimum of toluene and dried over anhydrous magnesium sulfate. The toluene was removed on a rotary evaporator to give 61.5 g (81% yield) of a clear colorless oil.

EXAMPLE 2

This example illustrates the preparation of N,N-dihexylurea. This material was synthesized in a manner similar to that of Example 1 using di-n-hexylamine and potassium cyanate, except that a 25% excess of potassium cyanate was used and methanol was required to dissolve a solid hydrate that formed on addition of water to di-n-hexylamine. Yield: 89%.

Other dialkyl ureas including N,N-dipropyl urea, N,N-dipentyl urea and N-cyclohexyl-N-methyl urea were prepared similarly. Some of the more water soluble products had to be extracted with toluene from the aqueous solution at the end of the reaction.

EXAMPLE 3

(a) A commercial photoresist based on a novolac-type cresol/formaldehyde resin and a diazonaphthoquinone (DNQ) photosensitive agent (SPR510A, Shipley) was coated on a 4 inch silicon wafer to a thickness of approximately 1 micron following the manufacturer's instructions. Different areas of the resist were then exposed to UV radiation centered at 365 nm (mercury i-line) at various levels of intensity by positioning the wafer under an aperture opening and operating a shutter. The resulting exposed wafer was developed (60 seconds) in a puddle of 0.262 M tetramethylammonium hydroxide (TMAH) containing sufficient 1,1-dipentyl urea (0.05 wt %, 500 ppm) ) to lower the surface tension of the developer to 42 dynes/cm. The various portions of the wafer were then examined for film thickness using a Filmetrics F20 Thin-Film Measuring System (San Diego, Calif.) and the results were compared to the film thicknesses before exposure and developing. The Normalized Film Thickness is a dimensionless ratio and was calculated by dividing the pre-exposure film thickness by the post-development film thickness. The results are shown in Table 1, Example 3(a). These data show outstanding selectivity of the developer solution for dissolution of the highly exposed resist vs. mildly exposed resist.

(b) Another commercially available photoresist (OCG 825 20 cS, Olin Corporation) was used to coat a 4 inch silicon wafer with a film thickness of approximately 1 micron. This resist is designed to be much more soluble in developer solutions and was used with 0.131M TMAH. Different areas of the resist were then exposed to UV radiation centered at 365 nm (mercury i-line) at various levels of intensity by positioning the wafer under an aperture opening and operating a shutter. Table 1, Example 3(b) shows data for the dissolution of exposed resist with 0.131 M TMAH containing 0.045 wt % (450 ppm) 1,1-dipentyl urea using a development time of 60 seconds. Again, the data show outstanding selectivity, even with this highly sensitive photoresist formulation.

(c) Similarly, 1,1-dibutyl urea (0.25 wt %) was used to formulate a 0.262N solution of TMAH to a surface tension of 41.5 dynes/cm. The dissolution behavior observed with the SPR510A resist using the procedure of Example 3(b) is shown in Table 1, Example 3(c).

TABLE 1

| Example 3(a) 1,1-Dipentyl Urea | | Example 3(b) 1,1-Dipentyl Urea | | Example 3(c) 1,1-Dibutyl Urea | |
| --- | --- | --- | --- | --- | --- |
| Dose (mJ/cm$^2$) | Normalized Film Thickness | Dose (mJ/cm$^2$) | Normalized Film Thickness | Dose (mJ/cm$^2$) | Normalized Film Thickness |
| 2.68 | 1.00 | 8.8 | 0.98 | 8.5 | 1.00 |
| 2.83 | 1.00 | 10.6 | 0.97 | 10.2 | 1.00 |
| 3.27 | 1.00 | 12.3 | 0.97 | 11.9 | 1.00 |
| 10.04 | 1.00 | 15.8 | 0.93 | 15.3 | 0.99 |
| 11.97 | 0.99 | 19.4 | 0.89 | 20.4 | 0.87 |
| 17.54 | 0.99 | 24.6 | 0.75 | 25.5 | 0.94 |
| 25.50 | 0.99 | 31.7 | 0.60 | 32.3 | 0.72 |
| 36.43 | 0.92 | 40.5 | 0.41 | 39.1 | 0.45 |
| 53.15 | 0.51 | 49.3 | 0.30 | 49.4 | 0.25 |
| 66.68 | 0.20 | 63.4 | 0.07 | 63.0 | 0.10 |
| 92.85 | 0.06 | 79.2 | 0 | 80.0 | 0 |
| 118.42 | 0 | 100.3 | 0 | 100.4 | 0 |
| 153.51 | 0 | | | | |
| 197.59 | 0 | | | | |
| 222.79 | 0 | | | | |

EXAMPLE 4

Foam tests were made in TMAH developer solutions formulated with 1,1-dipentyl urea as surfactant and with three commercial developer solutions containing surfactants. Data were collected utilizing a foam generating apparatus whereby nitrogen gas was passed through a frit and bubbled through 100 mL of the solutions at 50 mL/min. Except for the commercial developer solutions which were used as received, all solutions contained 2.4 wt % TMAH in water with enough surfactant to lower surface tension to about 43 dyne/cm. The results are given in Table 2.

TABLE 2

| | Foam Volume (mL) | | | |
| --- | --- | --- | --- | --- |
| Time (min) | 1,1-dipentyl urea | OCG 934 3:2[a] | MF-702[b] | MF-319[b] |
| 0 | 0 | 0.0 | 0.0 | 0.0 |
| 1 | 7.8 | 15.6 | 39.5 | 51.1 |
| 2 | 7.8 | 17.2 | 72.6 | 91.4 |
| 3 | 8.0 | 24.2 | 107.4 | 135.3 |
| 4 | 8.0 | 22.9 | 156.4 | 176.8 |
| 5 | 8.1 | 22.3 | 172.8 | 237.8 |
| 6 | 8.3 | 22.0 | 236.2 | 275.1 |
| 7 | 8.3 | 25.8 | 287.0 | 321.3 |
| 8 | 8.5 | 25.8 | 307.6 | 372.6 |
| 9 | 8.6 | 25.5 | 326.9 | 416.7 |
| 10 | 8.6 | 26.2 | 301.3 | 460.6 |
| 11 | 8.5 | 26.5 | 340.2 | 502.0 |
| 12 | 8.5 | 26.9 | 404.8 | 544.9 |
| 13 | 8.5 | 26.9 | 438.6 | 594.7 |
| 14 | 8.6 | 26.9 | 488.6 | 647.5 |
| 15 | 8.7 | 27.3 | 514.9 | 681.1 |

[a]Commercial developer solution from Olin (now Arch Chemical)
[b]Commercial developer marketed under the Microposit ® trademark by Shipley The above data in Table 2 show that TMAH developer solutions containing the 1,1-dipentyl urea as the e surfactant developed considerably less foam than the commercial developer solutions containing other types of surfactant. It is quite surprising that N,N-dialkylureas containing 6 to 12 total carbon atoms in the alkyl groups increases the ability of these materials to reduce both surface tension and foaming tendency in TMAH developer solutions while maintaining good contrast for photoresist developing applications. These goals are achieved while lowering the level of dialkyl urea required for a desired surface tension reduction.

In sum, the ability of a surfactant to reduce surface tension under both equilibrium and dynamic conditions is of great importance in the performance of waterbased photoresist developers. Low dynamic surface tension results in enhanced wetting and spreading under the dynamic conditions of application, resulting in more efficient use of the compositions and fewer defects. Foam control is a particularly important attribute in photoresist developer/electronics cleaning compositions.

STATEMENT OF INDUSTRIAL APPLICATION

The invention provides compositions suitable for use in photoresist developer/electronics cleaning corn positions.

We claim:

1. In an aqueous photoresist developer composition containing a surfactant, the improvement which comprises employing as the surfactant an N,N-dialkyl urea compound of the structure

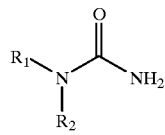

where R and R' are independently C1 to C6 alkyl or cycloalkyl, the sum of the carbon atoms in both R and R' being 6 to 12.

2. The developer composition of claim 1 in which an aqueous solution of the N,N-dialkyl urea demonstrates a dynamic surface tension of less than 45 dynes/cm at a concentration of $\leq 5$ wt % in water at 23° C. and 1 bubble/second according to the maximum-bubble-pressure method.

3. The developer composition of claim 1 in which the carbon atoms of R and R' total 8 to 10.

4. The developer composition of claim 1 in which the urea is N,N-dibutyl urea.

5. The developer composition of claim 1 in which the urea is N,N-dipentyl urea.

6. The developer composition of claim 1 in which the urea is N,N-dihexyl urea.

7. The developer composition of claim 2 in which the measurement is made at 20 bubbles/second.

8. The developer composition of claim 1 which contains tetramethylammonium hydroxide.

9. The developer composition of claim 3 which contains tetramethylammonium hydroxide.

10. The developer composition of claim 5 which contains tetramethylammonium hydroxide.

11. In a process for developing a photoresist after exposure to radiation by applying to the photoresist surface a developer solution containing a surface tension lowering amount of a surfactant, the improvement which comprises using as the surfactant an N,N-dialkyl urea compound having the structure

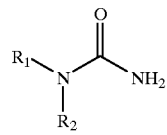

where R and R' are independently C1 to C6 alkyl or cycloalkyl, the sum of the carbon atoms in both R and R' being 6 to 12.

12. The process of claim 11 in which the carbon atoms of R and R' total 8 to 10.

13. The process of claim 11 in which the urea is N,N-dibutyl urea.

14. The process of claim 11 in which the urea is N,N-dipentyl urea.

15. The process of claim 11 in which the urea is N,N-dihexyl urea.

16. The process of claim 11 in which the developer solution contains tetramethylammonium hydroxide.

17. The process of claim 12 in which the developer solution contains tetramethylammonium hydroxide.

18. The process of claim 13 in which the developer solution contains tetramethylammonium hydroxide.

19. An aqueous electronics cleaning composition comprising in water the following components
   0.1 to 3 wt % tetramethylammonium hydroxide,
   0 to 4 wt % phenolic compound; and
   10 to 10,000 ppm N,N-dialkyl urea,
the N,N-dialkyl urea compound having the structure

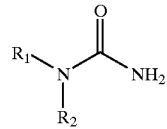

where R and R' are independently C1 to C6 alkyl or cycloalkyl, the sum of the carbon atoms in both R and R' being 6 to 12.

20. The aqueous electronics cleaning composition of claim 19 in which the urea is N,N-dipentyl urea.

* * * * *